(12) United States Patent
Sugiura

(10) Patent No.: US 7,795,929 B2
(45) Date of Patent: Sep. 14, 2010

(54) VOLTAGE DETECTION CIRCUIT AND OSCILLATOR USING THE SAME

(75) Inventor: Masakazu Sugiura, Chiba (JP)

(73) Assignee: Seiko Instruments Inc. (JP)

( * ) Notice: Subject to any disclaimer, the term of this patent is extended or adjusted under 35 U.S.C. 154(b) by 130 days.

(21) Appl. No.: 12/231,270

(22) Filed: Aug. 28, 2008

(65) Prior Publication Data

US 2009/0066429 A1    Mar. 12, 2009

(30) Foreign Application Priority Data

Aug. 31, 2007    (JP)    ............... 2007-225361

(51) Int. Cl.
     *H03K 5/153*    (2006.01)
(52) U.S. Cl. .......................... 327/77; 327/62
(58) Field of Classification Search .......... 327/58, 327/62, 70, 74, 76, 77
     See application file for complete search history.

(56) References Cited

U.S. PATENT DOCUMENTS 5,801,552 A * 9/1998 Moore ...................... 327/62

6,236,256 B1 * 5/2001 Brownlow et al. ........... 327/333
6,239,625 B1 * 5/2001 Abe ............................ 327/58
7,034,581 B2 * 4/2006 Sudou ......................... 327/77
2003/0067304 A1   4/2003 Miyagi ....................... 324/522

FOREIGN PATENT DOCUMENTS

JP    2003115753    4/2003

* cited by examiner

*Primary Examiner*—Hai L Nguyen
(74) *Attorney, Agent, or Firm*—Adams & Wilks

(57) ABSTRACT

Provided is a voltage detection circuit that outputs a detection result when a voltage to be measured exceeds a predetermined voltage or falls below the predetermined voltage at a speed higher than that of a conventional case. The voltage detection circuit according to the present invention includes an input buffer that outputs a detection voltage to be input as an input voltage, and a voltage detection section that accelerates a rising of the input voltage in a transient state where the input voltage exceeds a predetermined threshold value, and accelerates a dropping of the input voltage in a transient state where the input voltage falls below the predetermined threshold value. The voltage detection circuit accelerates a change in the input voltage to output the detection result from an output buffer at high speed.

9 Claims, 6 Drawing Sheets

FIG. 9 PRIOR ART
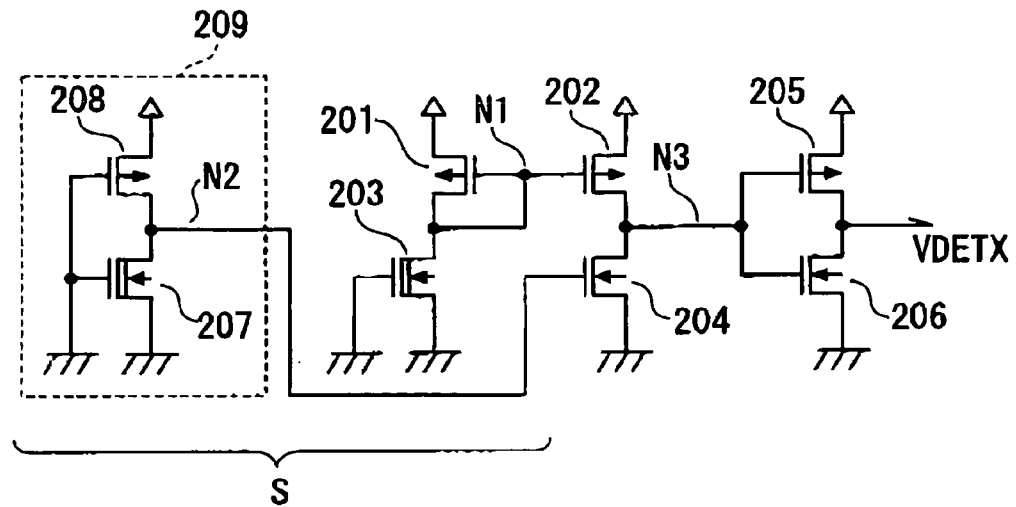
FIG. 10A PRIOR ART
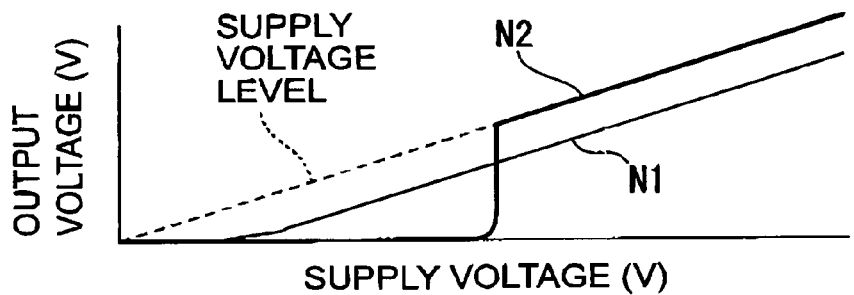
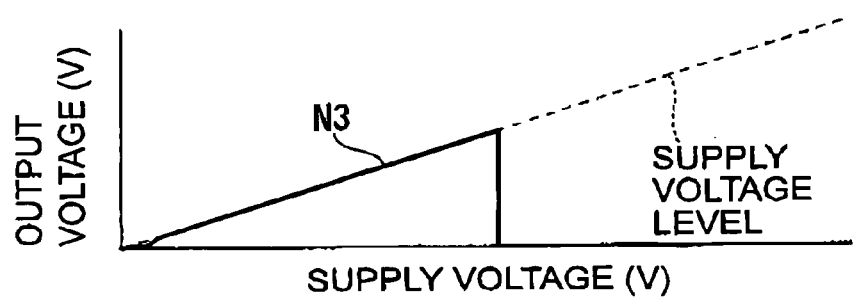
FIG. 10B PRIOR ART

VOLTAGE DETECTION CIRCUIT AND OSCILLATOR USING THE SAME

BACKGROUND OF THE INVENTION

1. Field of the Invention

The present invention relates to a voltage detection circuit that detects a change in voltage such as a supply voltage.

2. Description of the Related Art

Up to now, in order to detect a state in which a supply voltage that is applied in a semiconductor integrated circuit drops and circuit operation becomes unstable, there has been used a voltage detection circuit configured as shown in FIG. 9 (for example, refer to JP 2003-115753 A).

A bias circuit 209 is made up of a p-channel MOS transistor 208 and an n-channel depletion MOS transistor 207 whose gates are grounded, and which are connected in series between the supply voltage and a ground point. The n-channel depletion MOS transistor 207 operates as a constant current element.

A current mirror circuit is made up of p-channel MOS transistors 201 and 202 whose gates are commonly connected to each other. The drain of the MOS transistor 201 is connected with an n-channel depletion MOS transistor 203 as a constant current element, and the drain of the MOS transistor 202 functions as an output terminal.

The drain of the MOS transistor 202 is connected with the drain of an n-channel MOS transistor 204 having a gate connected to the drain of the MOS transistor 208 and a source grounded.

Also, the drain of the MOS transistor 202 is connected with a CMOS inverter, including a p-channel MOS transistor 205 and an n-channel MOS transistor 206, as an amplifying circuit.

Then, as shown in FIGS. 10A and 10B, when the supply voltage exceeds a given voltage, N2 becomes an "H" level (FIG. 10A), a voltage that is applied to the gate of the CMOS inverter changes from the "H" level (supply voltage) to an "L" level (ground potential) (FIG. 10B), and the above voltage detection circuit outputs a signal of the "H" level.

The above circuit outputs a signal of the "L" level when the detected supply voltage is equal to or lower than a predetermined voltage, and outputs a signal of the "H" level when the detected supply voltage exceeds the predetermined voltage.

However, in the voltage detection circuit disclosed in JP 2003-115753 A, there are many cases in which the aspect ratio (W/L) of the depletion MOS transistor 203 is reduced from the viewpoint of the necessity of power saving to reduce a current value that is always consumed. Also, since the MOS transistors 205 and 206 at the output stage are frequently large in gate area, the gate capacities become larger.

For that reason, in the above conventional example, it takes time to charge or discharge electric charges with respect to the gate capacity and the parasitic capacity, and therefore there arises such a problem that it takes time for N3 to change the state from the "H" level to the "L" level, or to change the state from the "L" level to the "H" level.

SUMMARY OF THE INVENTION

The present invention has been made in view of the above circumstances, and therefore an object of the present invention is to provide a voltage detection circuit that outputs the detection results when a voltage to be measured exceeds a predetermined voltage or becomes lower than the predetermined voltage, at a higher speed than that of the conventional case.

A voltage detection circuit according to the present invention includes: an input buffer including a current source and a first MOS transistor which are connected in series, which outputs a detection voltage which is input to a gate of the first MOS transistor as an input voltage; an output buffer including a second MOS transistor of a p-channel type having a source connected to a power supply and a drain connected to a signal output terminal, and a third MOS transistor of an n-channel type having a source grounded and a drain connected to the signal output terminal; a timing adjustment circuit having a signal input terminal connected to a drain of the first MOS transistor, a first output terminal connected to a gate of the second MOS transistor, a second output terminal connected to a gate of the third MOS transistor, which drops voltage of the first output terminal and voltage of the second output terminal when the input voltage that is input to the signal input terminal rises, raises the voltage of the first output terminal and the voltage of the second output terminal when the input voltage drops, and shifts dropping timing and raising timing between the voltage of the first output terminal and the voltage of the second output terminal; and a voltage detection section that accelerates rising and dropping speeds of the input voltage based on a change in the voltage of the first output terminal and the voltage of the second output terminal, and a change in a voltage of the signal output terminal.

In a voltage detection circuit according to the present invention, the input buffer includes a constant current source, and the first MOS transistor of one of the n-channel type and the p-channel type, which is connected in series with the constant current source between the power supply and a ground point, and which has a gate applied with the detection voltage, and the voltage detection section includes: a fourth MOS transistor of the p-channel type having a source connected to the power supply, and a gate connected to the signal output terminal; a fifth MOS transistor of the p-channel type having a source connected to a drain of the fourth MOS transistor, a gate connected to the first output terminal, and a drain connected to a connection point of the first MOS transistor and the current source; a sixth MOS transistor of the n-channel type having a drain connected to the drain of the fifth MOS transistor, and a gate connected to the second output terminal; and a seventh transistor of the n-channel type having a drain connected to a source of the sixth MOS transistor, a gate connected to the signal output terminal, and a source grounded.

In a voltage detection circuit according to the present invention, the timing adjustment circuit drops the voltage of the second output terminal at timing earlier than that of the first output terminal when the input voltage rises, and raises the voltage of the first output terminal at timing earlier than that of the second output terminal when the input voltage drops.

In a voltage detection circuit according to the present invention, the timing adjustment circuit includes: an eighth MOS transistor of the p-channel type having a source connected to the power supply, a gate connected to the signal input terminal, and a drain connected to the first output terminal; a ninth MOS transistor of the n-channel type having a drain connected to the second output terminal, a gate connected to the signal input terminal, and a source grounded; and a resistor that is connected between the first output terminal and the second output terminal.

In a voltage detection circuit according to the present invention, the timing adjustment circuit includes: a first delay circuit that transmits a change in the detection voltage with a delay when the detection voltage changes from an "L" level to an "H" level, and transmits the change in the detection voltage without the delay when the detection voltage changes from the "H" level to the "L" level; and a second delay circuit that transmits the change in the detection voltage with the delay when the detection voltage changes from the "H" level to the "L" level, and transmits the change in the detection voltage without the delay when the detection voltage changes from the "L" level to the "H" level.

In a voltage detection circuit according to the present invention, the first delay circuit includes a NOR circuit having one input connected to the signal input terminal, another input connected to the signal input terminal through a delay circuit, and an output terminal connected to the second output terminal, and the second delay circuit includes a NAND circuit having one input connected to the signal input terminal, another input connected to the signal input terminal through the delay circuit, and an output terminal connected to the first output terminal.

In a voltage detection circuit according to the present invention, the first delay circuit includes: a NAND circuit having one input connected to the signal input terminal, and an output connected to the first output terminal; and a first inverter having an input connected to the output of the NAND circuit, and the second delay circuit includes: a NOR circuit having one input connected to the signal input terminal, another input connected to an output of the first inverter, and an output connected to the second output terminal; and a second inverter having an input connected to the output of the NOR circuit, and an output connected to another input of the NAND circuit.

An oscillator according to the present invention includes any one of the above-mentioned voltage detection circuits that is inserted between an output terminal of a final-stage inverter of a ring oscillator having a plurality of stages of inverters connected to each other and an input terminal of a first-stage inverter of the ring oscillator.

An oscillator according to the present invention includes any one of the above-mentioned voltage detection circuits having an input connected to an output terminal of a final-stage inverter of a ring oscillator having a plurality of stages of inverters connected to each other, and an input buffer having an output connected to an input terminal of a first-stage inverter of the ring oscillator.

As described above, according to the present invention, the voltage detection section accelerates a rising in the input voltage in a transient state where the input voltage that is output from the input buffer exceeds the predetermined threshold value, and conversely the voltage detection section accelerates a dropping in the input voltage in a transient state where the input voltage falls below the predetermined threshold value. As a result, because a change in the voltage of the signal input terminal is accelerated, the results of the voltage detection can be output at a higher speed than that in the conventional case.

That is, according to the present invention, in the transient state where the input voltage exceeds the predetermined threshold value, a period during which the fourth MOS transistor turns on, the seventh transistor turns off according to the output of the output buffer, and the fifth MOS transistor and the eighth MOS transistor turn on according to the voltage of the first output terminal is generated to accelerate a rising in the potential of the signal input terminal. On the other hand, in the transient state where the voltage falls below the predetermined threshold value, a period during which the fourth MOS transistor turns off, the seventh transistor turns on according to the output of the output buffer, and the sixth MOS transistor and the ninth MOS transistor turn on according to the voltage of the second output terminal is generated to accelerate a dropping in the potential of the signal input terminal. As a result, the results of the voltage detection can be output at a higher speed than that of the conventional case.

Also, the conventional case suffers from the problem that the parasitic capacity is added in addition to a delay that determines the frequency with the results that a real frequency is deviated from a designed value, and that a high-precision ring oscillator cannot be constituted. According to the present invention, in order to alleviate the above problem, the voltage detection circuit is inserted into a loop of the ring oscillator or located at the output stage, to thereby suppress an influence of the parasitic capacity on the frequency so as to bring the real frequency closer to the designed frequency and to improve the precision.

BRIEF DESCRIPTION OF THE DRAWINGS

In the accompanying drawings:

FIG. 9 is a circuit diagram showing a configuration of a voltage detection circuit in a conventional example; and FIG. 10 is a waveform diagram for explaining an operation of the voltage detection circuit shown in FIG. 9.

DETAILED DESCRIPTION OF THE PREFERRED EMBODIMENTS

Figure 1:
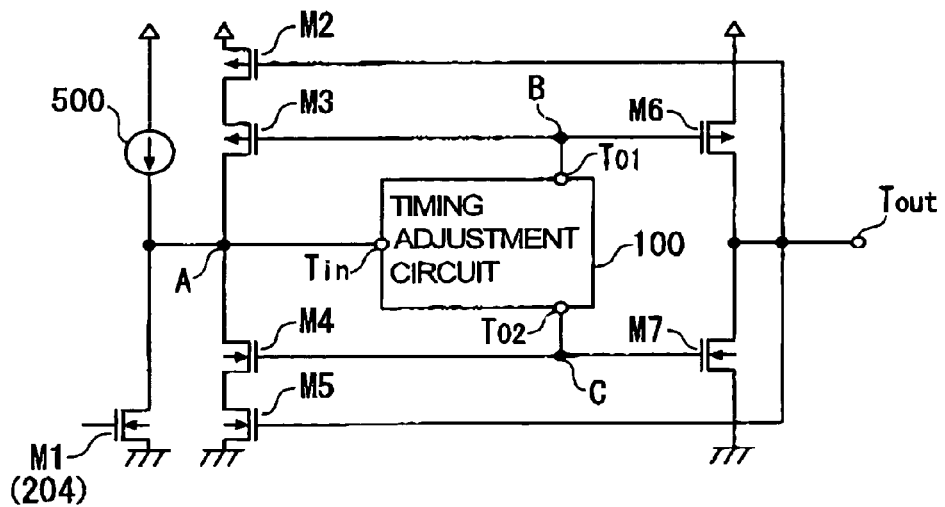
FIG. 1 is a block diagram for explaining a concept of a configuration of a voltage detection circuit according to an embodiment of the present invention.

Now, a description is given of a voltage detection circuit according to an embodiment of the present invention with reference to the accompanying drawings. FIG. 1 is a block diagram showing a configuration example of the voltage detection circuit according to the embodiment.

Referring to FIG. 1, the voltage detection circuit according to this embodiment includes a constant current source 500, p-channel MOS transistors M2, M3, and M6, n-channel MOS transistors M1, M4, M5, and M7, and a timing adjustment circuit 100.

When the voltage detection circuit is used for the voltage detection of a supply voltage, a circuit portion in a range of S shown in FIG. 9 is connected to the voltage detection circuit. That is, the constant current source 500 corresponds to a MOS transistor 202 of FIG. 9, the MOS transistor M1 corresponds to a MOS transistor 204, and the potential of a connection point A (N3) rises or drops according to the amount of current that flows in a process where the MOS transistor M1 changes to an on-state or an off-state with respect to a constant current.

Also, in the following description, a threshold voltage is indicative of a threshold value which is compared with the potential of the connection point A in order to determine whether the potential of the connection point A is detected as the "H" level or as the "L" level. It is determined that the potential of the connection point A is at the "H" level when the potential exceeds the threshold voltage, and the potential of the connection point A is at the "L" level when the potential falls below the threshold voltage.

The MOS transistor M1 has a drain connected to the constant current source 500 at the connection point A, a gate applied with a voltage to be detected, and a source grounded. The MOS transistor M2 has a source connected to a power supply, and a gate connected to a signal output terminal Tout. The MOS transistor M3 has a gate connected to a connection point B, a source connected to the drain of the MOS transistor M2, and a drain connected to the connection point A. The MOS transistor M4 has a gate connected to a connection point C, and a drain connected to the connection point A. The MOS transistor M5 has a drain connected to the source of the MOS transistor M4, a gate connected to a signal output terminal Tout, and a source grounded. The MOS transistor M6 has a source connected to the power supply, a gate connected to the connection point B and the gate of the MOS transistor M3, and a drain connected to the signal output terminal Tout. The MOS transistor M7 has a drain connected to the signal output terminal Tout, a gate connected to the connection point C and the gate of the MOS transistor M5, and a source grounded.

Alternatively, the MOS transistor M1 may not be connected to the constant current source 500, but the MOS transistor M1 may be of the p-channel type, and have a source connected to the power supply, a gate applied with the detection voltage to be detected, and a drain connected to the ground point through the constant current source 500.

The timing adjustment circuit 100 has a signal input terminal Tin connected to the connection point A, an output terminal To1 connected to the connection point B, and an output terminal To2 connected to the connection point C. In this example, the connection point B is connected to the gates of the MOS transistors M3 and M6, and the connection point C is connected to the gates of the MOS transistors M4 and M7 as described above.

Also, the timing adjustment circuit 100 changes timing of the voltage changes of a signal that is applied to the gate (connection point B) of the MOS transistor M6, which is output from the output terminal To1, and a signal that is applied to the gate (connection point C) of the MOS transistor M7, which is output from the output terminal To2 when the input voltage (voltage at the connection point A) which is input to the signal input terminal Tin exceeds a predetermined threshold voltage, or falls below the threshold voltage.

That is, the timing adjustment circuit 100 conducts the signal change from the "H" level to the "L" level for the output terminal To2 at earlier timing than for the output terminal To1 in the transient change where the input voltage rises from the lower voltage with respect to the threshold voltage, and exceeds the threshold voltage. On the other hand, the timing adjustment circuit 100 conducts the signal change from the "L" level to the "H" level for the output terminal To1 at earlier timing than for the output terminal To2 in the transient change where the input voltage drops from the higher voltage with respect to the threshold voltage, and falls below the threshold voltage.

Figure 2:
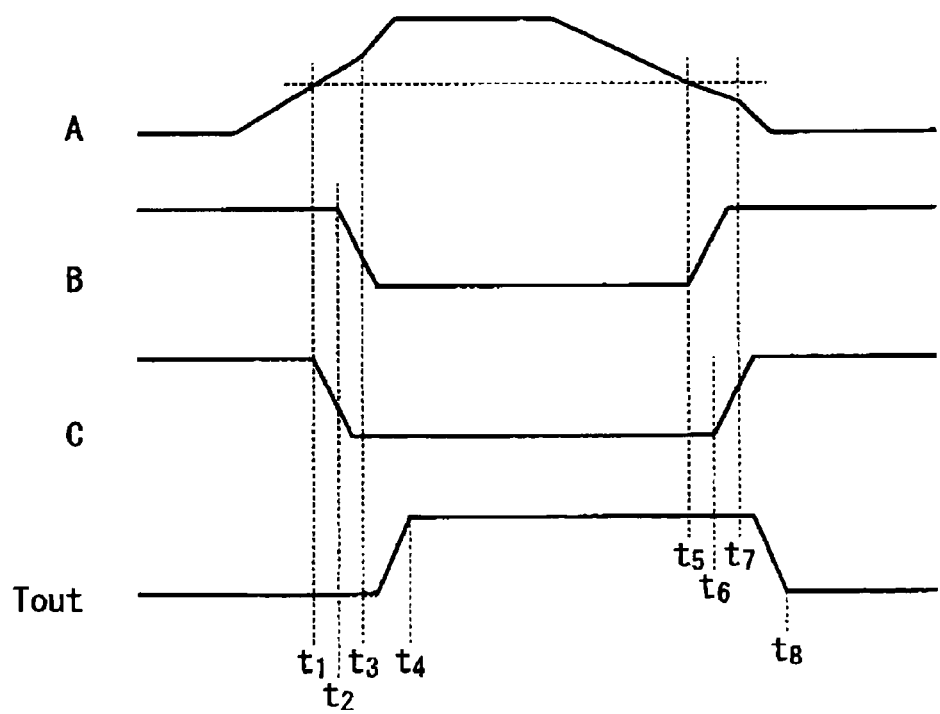
FIG. 2 is a waveform diagram for explaining an operation of the voltage detection circuit shown in FIG. 1.

Subsequently, a description is given of an operation of the voltage detection circuit according to this embodiment with reference to FIGS. 1 and 2. FIG. 2 is a waveform diagram showing an operation example of the voltage detection circuit according to this embodiment.

The voltage that is input to the gate of the MOS transistor M1 starts to change from the "H" level to the "L" level with the results that the potential of the connection point A rises from the "L" level to the "H" level, and exceeds the threshold voltage of the level change of the signal.

As a result, the timing adjustment circuit 100 starts the operation of changing the connection point C from the "H" level to the "L" level at such timing that the input voltage exceeds the threshold voltage. As a result, because the potential of the connection point drops, the MOS transistors M4 and M7 gradually move into the off-state (state in which no current flows) (time t1). At that time, the timing adjustment circuit 100 allows the connection point B to remain in the "H" level. For that reason, the signal output terminal Tout remains in the "L" level, and the MOS transistor M2 remains in the on-state.

Then, the timing adjustment circuit 100 starts a process of changing the potential of the connection point B from the "H" level to the "L" level after a predetermined time passes (after a delay), and then gradually turns the MOS transistors M3 and M6 into the on-state (state in which the current flows) (time t2).

As a result, the current starts to flow in the MOS transistors M3 and M6, and the signal output terminal Tout is at the "L" level at that time. For that reason, electric charges are supplied to the connection point A due to a current that flows through the MOS transistors M2 and M3, and the potential of the connection point A rapidly changes to the "H" level (time t3).

When the potential of the connection point A reaches the "H" level, the timing adjustment circuit 100 also completely brings the connection points B and C into the state of the "L" level (time t4).

As a result, the signal output terminal Tout is brought into the "H" level, thereby turning off the MOS transistor M2.

In this situation, although the MOS transistors M3 and M5 are in the on-state, the MOS transistors M2 and M4 are in the off-state. For that reason, both of a route to the power supply and a route to the ground potential are in a high-impedance state in the MOS transistors M2, M3, M4, and M5 (potential detection portion) which are connected in series between the power supply and the ground potential when being viewed from the connection point A.

That is, the timing adjustment circuit 100 brings the MOS transistor M4 into the off-state at earlier timing than that for the MOS transistor M3 in the transient state where the potential of the connection point A changes from the "L" level to the "H" level. Then, the current is supplied to the connection point A through the MOS transistors M2 and M3 for only a given period of time, and the potential of the connection point A rapidly changes from the "L" level to the "H" level.

Then, the detection voltage that is input to the gate of the MOS transistor M1 starts to change from the "L" level to the "H" level, whereby the potential of the connection point A drops from the "H" level to the "L" level, and falls below the threshold voltage.

As a result, the timing adjustment circuit 100 starts a process of changing the connection point B from the "L" level to the "H" level when the input voltage that is input to the signal input terminal Tin falls below the threshold voltage. As a result, the potential of the connection point B rises, and the timing adjustment circuit 100 gradually turns the MOS transistor M6 into the off-state (time t5).

At this time point, the timing adjustment circuit 100 allows the connection point C to remain in the "L" level. For that reason, the signal output terminal Tout remains in the "H" level, and the MOS transistor M5 is in the on-state.

Then, the timing adjustment circuit 100 starts to change the potential of the connection point C from the "L" level to the "H" level after a predetermined time passes (after a delay), and then gradually turns the MOS transistors M4 and M7 into the on-state (time t6).

As a result, the current starts to flow in the MOS transistors M4 and M7, and the signal output terminal Tout is at the "H" level at that time. For that reason, electric charges are discharged from the connection point A to the ground point through the MOS transistors M4 and M5, and the potential of the connection point A rapidly changes to the "L" level (time t7).

When the potential of the connection point A reaches the "L" level, the timing adjustment circuit 100 also completely brings the connection points B and C into the state of the "H" level (time t8).

As a result, the signal output terminal Tout is brought into the "L" level, thereby turning off the MOS transistor M5.

In this situation, although the MOS transistors M2 and M4 are in the on-state, the MOS transistors M3 and M5 are in the off-state. For that reason, both of the route to the power supply and the route to the ground potential are in a high-impedance state in the MOS transistors M2, M3, M4, and M5 which are connected in series between the power supply and the ground potential when being viewed from the connection point A.

That is, the timing adjustment circuit 100 brings the MOS transistor M3 into the off-state at earlier timing than that for the MOS transistor M5 in the transient state where the potential of the connection point A changes from the "H" level to the "L" level. Then, electric charges are discharged from the connection point A to the ground point through the MOS transistors M4 and M5 for only a given period of time, and the potential of the connection point A rapidly changes from the "H" level to the "L" level.

As described above, in this embodiment, when the potential of the connection point A changes in correspondence with a variation in the voltage to be detected, in a case where potential of the connection point A changes across the predetermined threshold value, the potential of the connection point A is changed at high speed, thereby making it possible to make the output timing of the voltage detection results from the signal output terminal Tout quicker than that in the conventional example.

Hereinafter, a description is given of a configuration example of the timing adjustment circuit shown in FIG. 1 below.

<First Configuration Example of Timing Adjustment Circuit 100>

Figure 3:
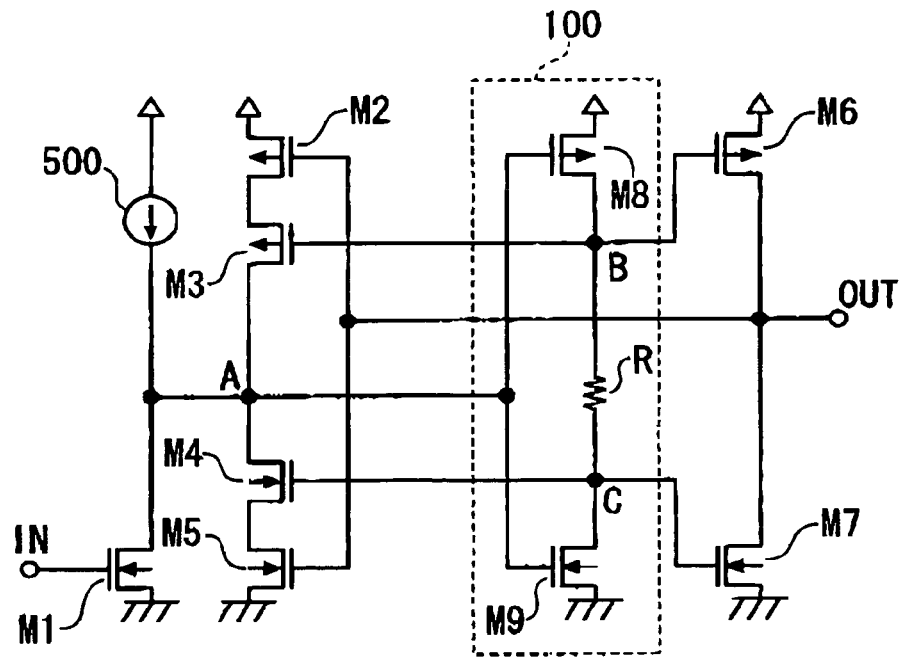
FIG. 3 is a block diagram showing a first configuration example of a timing adjustment circuit shown in FIG. 1.

A circuit shown in FIG. 3 is used as a first configuration example of the timing adjustment circuit 100 shown in FIG. 1. The timing adjustment circuit 100 includes a p-channel MOS transistor M8, an n-channel MOS transistor M9, and a resistor R. In the figure, the signal input terminal Tin of the timing adjustment circuit 100 is connected directly to the connection point A, the output terminal To1 thereof is connected directly to the connection point B, and the output terminal To2 thereof is connected directly to the connection point C.

The MOS transistor M8 has a source connected to the power supply, a gate connected to the connection point A, and a drain connected to the connection point B.

The MOS transistor M9 has a source grounded, a gate connected to the connection point A, and a drain connected to the connection point C. The resistor R is connected between the connection point B and the connection point C.

Subsequently, a description is given of an operation of the voltage detection circuit according to this embodiment with reference to FIGS. 2 and 3.

As with the above time t1, the potential of the connection point A starts to rise from the "L" level to the "H" level, and exceeds the threshold value of the MOS transistor M9. Then, the MOS transistor M9 allows the current to start to flow therein, and starts the potential change of the connection point C from the "H" level to the "L" level. The potential of the connection point C is reduced, whereby the MOS transistors M4 and M7 gradually move into the off-state (time t1). In this situation, when the MOS transistor M8 falls below the threshold value, the current that flows is gradually reduced. On the other hand, when the MOS transistor M9 exceeds the threshold value, the current that flows is gradually increased.

At that time point, because the MOS transistor M9 discharges the electric discharges of the connection point B through the resistor R, the current that flows through the resistor is restricted. As a result, timing at which the potential of the connection point B is reduced is delayed with respect to the connection point C, and hence the connection point B remains in the "H" level. For that reason, the signal output terminal Tout remains in the "L" level, and the MOS transistor M2 is in the on-state.

Then, when the potential of the connection point B gradually changes from the "H" level to the "L" level, and exceeds the threshold values of the MOS transistors M3 and M6 after a predetermined time passes (after a delay), the MOS transistors M3 and M6 gradually move into the on-state (time t2).

As a result, a current starts to flow in the MOS transistors M3 and M6. The signal output terminal Tout is the "L" level at that time point. Accordingly, the electric charges are supplied to the connection point A through the MOS transistors M2 and M3, and the potential of the connection point A rapidly changes to the "H" level (time t3).

When the potential of the connection point A reaches the "H" level, the MOS transistor M9 turns on, the MOS transistor M8 turns off, and the connection points B and C are completely brought into the "L" level.

As a result, the signal output terminal Tout becomes the "H" level, whereby the MOS transistor M2 turns off, and the MOS transistor M5 turns on (time t4).

Then, as with the above time t5, the potential of the connection point A starts to drop from the "H" level to the "L" level, and exceeds the threshold value of the MOS transistor M8. Then, the MOS transistor M8 allows a current to start to flow therein, and starts to gradually move the connection point B from the "L" level to the "H" level. The potential of the connection point B rises whereby the MOS transistors M3 and M6 gradually move into the off-state (time t5). In this situation, when the MOS transistor M8 also exceeds the threshold value, the current that flows is gradually increased. On the other hand, when the MOS transistor M9 falls below the threshold value, the current that flows is gradually decreased.

At that time point, because the MOS transistor M8 supplies the electric charges to the connection point C through the resistor R, the current that flows is restricted. As a result, timing at which the potential of the connection point C rises with respect to the connection point B is delayed, and the connection point C remains in the "L" level.

For that reason, the signal output terminal Tout remains in the "H" level, and the MOS transistor M5 is in the on-state.

Then, the potential of the connection point C gradually changes from the "L" level to the "H" level, and exceeds the threshold values of the MOS transistors M4 and M7 after a predetermined time passes (after a delay), whereby the MOS transistors M4 and M7 gradually move into the on-state (time t6).

As a result, because the MOS transistor M5 is in the on-state, a current starts to flow in the MOS transistors M4 and M7. The signal output terminal Tout is the "H" level at that time point. Accordingly, the electric charges are discharged from the connection point A through the MOS transistors M4 and M5, and the potential of the connection point A rapidly changes into the "L" level (time t7).

When the potential of the connection point A reaches the "L" level, the MOS transistor M8 turns on, the MOS transistor M9 turns off, and the connection points B and C are completely brought into the "H" level.

As a result, the signal output terminal Tout becomes the "L" level, whereby the MOS transistor M5 turns off, and the MOS transistor M2 turns on (time t8).

Alternatively, the above timing adjustment circuit 100 can include a first delay circuit (circuit that controls the connection point B), and a second delay circuit (circuit that controls the potential of the connection point C) as the functions. The first delay circuit delays the timing when the potential (input voltage) of the connection point A changes from the "L" level to the "H" level, and transmits a change in the detection voltage without delaying the timing when the potential of the connection point A changes from the "H" level to the "L" level. The second delay circuit delays the timing when the potential of the connection point A changes from the "H" level to the "L" level, and transmits a change in the detection voltage without delaying the timing when the potential of the connection point A changes from the "L" level to the "H" level. Those circuit configuration examples are described below.

<Second Configuration Example of Timing Adjustment Circuit 100>

Figure 4:
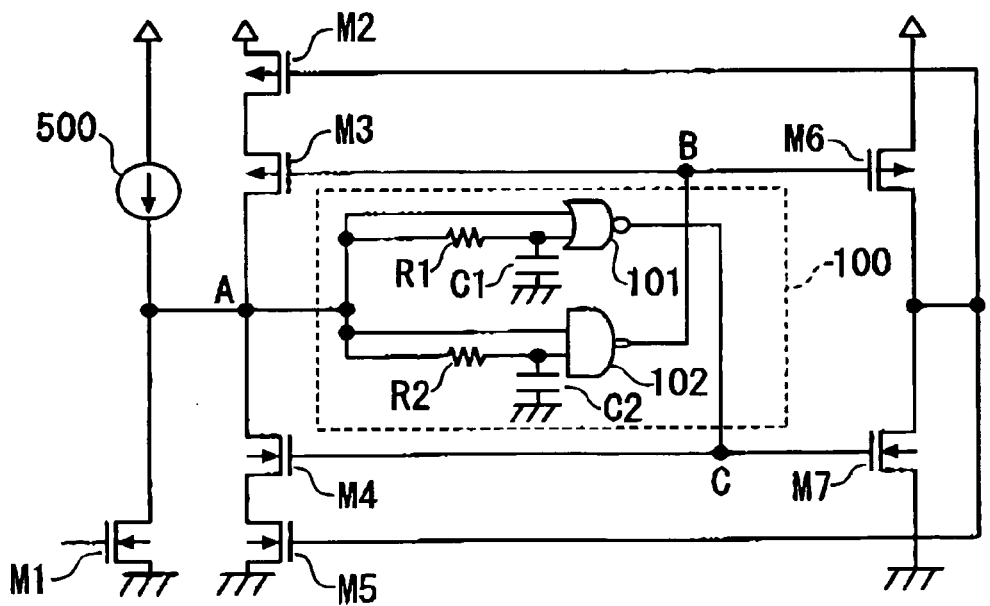
FIG. 4 is a block diagram showing a second configuration example of the timing adjustment circuit shown in FIG. 1.

A circuit shown in FIG. 4 is used as a second configuration example. The timing adjustment circuit 100 includes an NOR circuit 101 with two inputs, a NAND circuit 102 with two inputs, resistors R1 and R2, and capacitors C1 and C2.

Referring to the figure, the NAND circuit 102 has one input terminal connected to the connection point A, another input terminal connected to the connection point A through a delay circuit that is made up of the resistor R2 and the capacitor C2, and an output terminal connected to the connection point B. The resistor R2 has one end connected to the connection point A, and another end connected to another input terminal of the NAND circuit 102. The capacitor C2 is connected between another input terminal of the NAND circuit 102 and the ground point.

The NOR circuit 101 has one input terminal connected to the connection point A, another input terminal connected to the connection point A through a delay circuit that is made up of the resistor R1 and the capacitor C1, and an output terminal connected to the connection point C. The resistor R1 has one end connected to the connection point A, and another end connected to another input terminal of the NOR circuit 101. The capacitor C1 is connected between another input terminal of the NOR circuit 101 and the ground point.

Subsequently, a description is given of an operation of the voltage detection circuit according to this embodiment with reference to FIGS. 4 and 2.

As with the time t1 as has been already described, the potential of the connection point A starts to rise from the "L" level to the "H" level, and the potential that is input to one input terminal of the NOR circuit 101 rises. In this case, the NOR circuit 101 gradually drops the voltage at the output terminal. As a result, the potential of the connection point C starts to change from the "H" level to the "L" level. The potential of the connection point C drops whereby the MOS transistors M4 and M7 gradually move into the off-state (time t1).

At that time point, the NAND circuit 102 has one input terminal applied directly with the potential of the connection point A, and another input terminal to which the potential change of the connection point A is transmitted through the delay circuit which is made up of the resistor R2 and the capacitor C2. For that reason, in the NAND circuit 102, since the potential change of the connection point A into the "H" level is not transmitted to one terminal of the two input terminals, timing at which the potential of the connection point B is reduced is delayed with respect to the connection point C, and the connection point B remains in the "H" level. Accordingly, the signal output terminal Tout remains in the "L" level, and the MOS transistor M2 is in the on-state.

Then, the NAND circuit 102 starts to change the potential of the output terminal from the "H" level to the "L" level when a change in the potential from the "L" level to the "H" level is input to another input terminal after a delay that has been set by the delay circuit (resistor R2 and capacitor C2) in advance as compared with one input terminal.

As a result, when the potential of the connection point B gradually changes from the "H" level to the "L" level, and exceeds the threshold values of the MOS transistors M3 and M6, the MOS transistors M3 and M6 gradually move into the on-state (time t2).

Then, a current starts to flow in the MOS transistors M3 and M6, and the signal output terminal Tout is the "L" level at that time point. Accordingly, the electric charges are supplied to the connection point A through the MOS transistors M2 and M3, and the potential of the connection point A rapidly changes into the "H" level (time t3).

When the potential of the connection point A reaches the "H" level, the respective output terminals of the NAND circuit 102 and the NOR circuit 101 become the "L" level, and the connection points B and C are also completely brought into the "L" level.

As a result, the signal output terminal Tout becomes the "H" level, whereby the MOS transistor M2 turns off (time t4).

Then, as with the above time t5, the potential of the connection point A starts to drop from the "H" level to the "L" level, and the potential that is input to one input terminal of the NAND circuit 102 is reduced. In this case, the NAND circuit 102 gradually raises the voltage of the output terminal. As a result, the potential of the connection point B starts to change from the "L" level to the "H" level. When the potential of the connection point B rises, the MOS transistors M3 and M6 gradually move into the off-state (time t5).

At that time point, the NOR circuit 101 has one input terminal applied directly with the potential of the connection point A, and another input terminal to which the potential change of the connection point A is transmitted through the delay circuit that is made up of the resistor R1 and the capacitor C1. For that reason, in the NOR circuit 101, since the potential change of the connection point A into the "L" level is not transmitted to one terminal of the two input terminals, timing at which the potential of the connection point C rises is delayed with respect to the connection point B, and the connection point C remains in the "L" level. Accordingly, the signal output terminal Tout remains in the "H" level, and the MOS transistor M5 is in the on-state.

Then, the NOR circuit 101 starts to change the potential of the output terminal from the "L" level to the "H" level when a change in the potential from the "H" level to the "L" level is input to another input terminal after a delay that has been set by the delay circuit in advance as compared with one input terminal.

With the above operation, the potential of the connection point C gradually changes from the "L" level to the "H" level and exceeds the threshold values of the MOS transistors M4 and M7. Then, the MOS transistors M4 and M7 gradually move into the on-state (time t6).

As a result, a current starts to flow in the MOS transistors M4 and M7. The signal output terminal Tout is the "L" level at that time point. Accordingly, the electric charges are discharged from the connection point A through the MOS transistors M4 and M5, and the potential of the connection point A rapidly changes into the "L" level (time t7).

When the potential of the connection point A reaches the "L" level, the respective output terminals of the NAND circuit 102 and the NOR circuit 101 become the "H" level, and the connection points B and C are also completely brought into the "H" level (time t8).

As a result, the signal output terminal Tout becomes the "L" level, whereby the MOS transistor M5 turns off.

<Third Configuration Example of Timing Adjustment Circuit 100>

Figure 5:
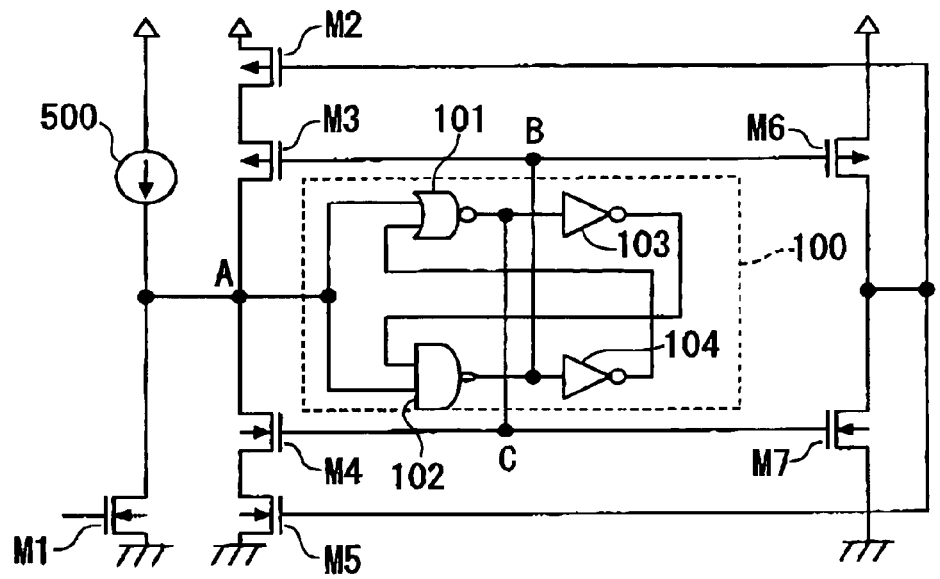
FIG. 5 is a block diagram showing a third configuration example of the timing adjustment circuit shown in FIG. 1.

A circuit shown in FIG. 5 is used as a third configuration example. The timing adjustment circuit 100 includes the NOR circuit 101 with two inputs, the NAND circuit 102 with two inputs, and inverters 103 and 104.

Referring to the figure, the NAND circuit 102 has one input terminal connected to the connection point A, another input terminal connected to an output terminal of the inverter 103, and the output terminal connected to an input terminal of the inverter 104 and the connection point B.

The NOR circuit 101 has one input terminal connected to the connection point A, another input terminal connected to an output terminal of the inverter 104, and the output terminal connected to an input terminal of the inverter 103 and the connection point C.

In the initial state of the operation of the circuit shown in FIG. 5 which is described below, the connection point A is the "L" level, and the connection points B and C are the "H" level.

As with the time t1 as has been already described, the potential of the connection point A starts to rise from the "L" level to the "H" level, and the potential that is input to one input terminal of the NOR circuit 101 rises. In this case, the NOR circuit 101 gradually drops the voltage at the output terminal.

As a result, the potential of the connection point C starts to change from the "H" level to the "L" level. When the potential of the connection point C is reduced, the MOS transistors M4 and M7 gradually move into the off-state, and the inverter 104 starts to change the output terminal from the "L" level to the "H" level (time t1).

At that time point, the NAND circuit 102 has one input terminal applied directly with the potential of the connection point A, and another input terminal connected to the output terminal of the inverter 103. Therefore, the potential change of the connection point A is delayed and transmitted for a delay time of the potential change of the output terminal of the inverter 103. For that reason, in the NAND circuit 102, because an output of the inverter 104 does not change, the potential change of the connection point A into the "H" level is not transmitted to one terminal of the two input terminals. Accordingly, timing at which the potential of the connection point B is reduced is delayed with respect to the connection point C, and the connection point B remains in the "H" level.

Accordingly, the signal output terminal Tout remains in the "L" level, and the MOS transistor M2 is in the on-state.

Then, the NAND circuit 102 starts to change the potential of the output terminal from the "H" level to the "L" level when a change in the potential from the "L" level to the "H" level is input to another input terminal after the signal of the connection point A has been input to one input terminal, that is, after a delay of the signal due to the inverter 103.

As a result, when the potential of the connection point B gradually changes from the "H" level to the "L" level, and exceeds the threshold values of the MOS transistors M3 and M6, the MOS transistors M3 and M6 gradually move into the on-state (time t2).

Then, a current starts to flow in the MOS transistors M3 and M6, and the signal output terminal Tout is the "L" level at that time point. Accordingly, the electric charges are supplied to the connection point A through the MOS transistors M2 and M3, and the potential of the connection point A rapidly changes into the "H" level (time t3).

When the potential of the connection point A reaches the "H" level, the respective output terminals of the NAND circuit 102 and the NOR circuit 101 become the "L" level, and the connection points B and C are also completely brought into the "L" level As a result, the signal output terminal Tout becomes the "H" level, whereby the MOS transistor M2 turns off (time t4).

Then, as with the above time t5, the potential of the connection point A starts to drop from the "H" level to the "L" level, and the potential that is input to one input terminal of the NAND circuit 102 is reduced. In this case, the NAND circuit 102 gradually raises the voltage of the output terminal.

As a result, the potential of the connection point B starts to change from the "L" level to the "H" level. When the potential of the connection point B rises, the MOS transistors M3 and M6 gradually move into the off-state, and the inverter 103 starts to change the output terminal from the "H" level to the "L" level (time t5).

At that time point, the NOR circuit 101 has one input terminal applied directly with the potential of the connection point A, and another input terminal connected to the output terminal of the inverter 104. Therefore, the potential change of the connection point A is delayed and transmitted for a delay time of the potential change of the output terminal of the inverter 104. For that reason, in the NOR circuit 101, because the output of the inverter 104 does not change, the potential change of the connection point A into the "L" level is not transmitted to another input terminal. Accordingly, timing at which the potential of the connection point C is reduced is delayed with respect to the connection point B, and the connection point C remains in the "L" level. Accordingly, the signal output terminal Tout remains in the "H" level, and the MOS transistor M5 is in the on-state.

Then, the NOR circuit 101 starts to change the potential of the output terminal from the "L" level to the "H" level when a change in the potential from the "H" level to the "L" level is input to another input terminal after a delay of the time during which the potential of the output terminal of the inverter 104 changes as compared with one input terminal.

With the above operation, the potential of the connection point C gradually changes from the "L" level to the "H" level and exceeds the threshold values of the MOS transistors M4 and M7. Then, the MOS transistors M4 and M7 gradually move into the on-state (time t6).

As a result, a current starts to flow in the MOS transistors M4 and M7. The signal output terminal Tout is the "H" level at that time point. Accordingly, the electric charges are discharged from the connection point A through the MOS transistors M4 and M5, and the potential of the connection point A rapidly changes into the "L" level (time t7).

When the potential of the connection point A reaches the "L" level, the respective output terminals of the NAND circuit 102 and the NOR circuit 101 become the "H" level, and the connection points B and C are also completely brought into the "H" level (time t8).

As a results the signal output terminal Tout becomes the "L" level, whereby the MOS transistor M5 turns off.

<Another Configuration Example of Voltage Detection Circuit>

Figure 6:
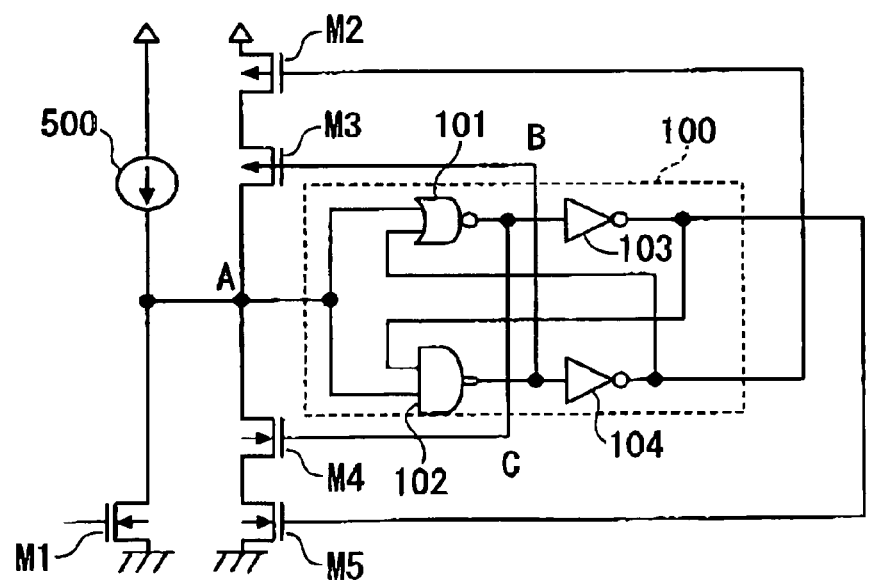
FIG. 6 is a block diagram showing a configuration of a voltage detection circuit according to another embodiment of the present invention.

A circuit shown in FIG. 6 is used as another configuration example of the voltage detection circuit according to this embodiment. The configuration of the timing adjustment circuit 100 is identical with that of FIG. 5, but the MOS transistors M6 and M7 which are the output stage of FIG. 5 are removed from the configuration. Hereinafter, only configurations different from FIG. 5 are described. In the case of the circuit shown in FIG. 6, the detection output is output from the connection point A, that is, the connection point A also serves as the signal output terminal.

The inverter 104 has an output terminal connected to the gate of the MOS transistor M2 in addition to another input terminal of the NOR circuit 101.

The inverter 103 has an output terminal connected to the gate of the MOS transistor M5 in addition to another input terminal of the NAND circuit 102.

In the initial state of the operation of the circuit shown in FIG. 6 which is described below, the connection point A is the "L" level, and the connection points B and C are the "H" level.

As with the time t1 as has been already described, the potential of the connection point A starts to rise from the "L" level to the "H" level, and the potential that is input to one input terminal of the NOR circuit 101 gradually rises. Then, the NOR circuit 101 gradually drops the voltage at the output terminal in correspondence with the rising of the potential.

As a result, the potential of the connection point C starts to change from the "H" level to the "L" level. When the potential of the connection point C is reduced, the MOS transistor M4 gradually moves into the off-state, and the inverter 103 starts to change the output terminal from the "L" level to the "H" level (time t1).

At that time point, the NAND circuit 102 has one input terminal applied directly with the potential of the connection point A, and another input terminal connected to the output terminal of the inverter 103. Therefore, the potential change of the connection point A is delayed and transmitted for a delay time of the potential change of the output terminal of the inverter 103. For that reason, in the NAND circuit 102, because the output of the inverter 103 does not change, the potential change of the connection point A into the "H" level is not transmitted to one terminal of the two input terminals. Accordingly, timing at which the potential of the connection point B is reduced is delayed with respect to the connection point C, and the connection point B remains in the "H" level. Accordingly, the output terminal of the inverter 104 remains in the "L" level, and the MOS transistor M2 is in the on-state.

Then, the NAND circuit 102 starts to change the potential of the output terminal from the "H" level to the "L" level when a change in the potential from the "L" level to the "H" level is input to another input terminal after a delay due to the inverter 103 as compared with one input terminal.

As a result, when the potential of the connection point B gradually changes from the "H" level to the "L" level, and exceeds the threshold value of the MOS transistor M3, the MOS transistor M3 gradually moves into the on-state (time t2).

Then, a current starts to flow in the MOS transistor M3, and the output terminal of the inverter 104 is the "L" level at that time point. Accordingly, the electric charges are supplied to the connection point A through the MOS transistors M2 and M3, and the potential of the connection point A rapidly changes into the "H" level (time t3).

When the potential of the connection point A reaches the "H" level, the respective output terminals of the NAND circuit 102 and the NOR circuit 101 become the "L" level, and the connection points B and C are also completely brought into the "L" level. As a result, the output terminal of the inverter 104 becomes the "H" level, whereby the MOS transistor M2 turns off (time t4).

Then, as with the above time t5, the potential of the connection point A starts to drop from the "H" level to the "L" level, and the potential that is input to one input terminal of the NAND circuit 102 is reduced. In this case, the NAND circuit 102 gradually raises the voltage of the output terminal.

As a result, the potential of the connection point B starts to change from the "L" level to the "H" level. When the potential of the connection point B rises, the MOS transistor M3 gradually moves into the off-state, and the inverter 104 starts to change the output terminal from the "H" level to the "L" level (time t5).

At that time point, the NOR circuit 101 has one input terminal applied directly with the potential of the connection point A, and another input terminal connected to the output terminal of the inverter 104. Therefore, the potential change of the connection point A is delayed and transmitted for a delay time period of the potential change of the output terminal of the inverter 104. For that reason, in the NOR circuit 101, because the output of the inverter 104 does not change, the potential change of the connection point A into the "L" level is not transmitted to one terminal of the two input terminals. Accordingly, timing at which the potential of the connection point C is reduced is delayed with respect to the connection point B, and the connection point C remains in the "L" level. Accordingly, the output terminal of the inverter 103 remains in the "H" level, and the MOS transistor M5 is in the on-state.

Then, the NOR circuit 101 starts to change the potential of the output terminal from the "L" level to the "H" level when a change in the potential from the "H" level to the "L" level is input to another input terminal after a delay of the time during which the potential of the output terminal of the inverter 104 changes as compared with one input terminal.

With the above operation, the potential of the connection point C gradually changes from the "L" level to the "H" level and exceeds the threshold value of the MOS transistor M4. Then, the MOS transistor M4 gradually moves into the on-state (time t6).

As a result, a current starts to flow in the MOS transistor M4. The output terminal of the inverter 103 is the "H" level at that time point. Accordingly, the electric charges are discharged from the connection point A through the MOS transistors M4 and M5, and the potential of the connection point A rapidly changes into the "L" level (time t7).

When the potential of the connection point A reaches the "L" level, the respective output terminals of the NAND circuit 102 and the NOR circuit 101 become the "H" level, and the connection points B and C are also completely brought into the "H" level (time t8). As a result, the output terminal of the inverter 103 becomes the "L" level, whereby the MOS transistor M5 turns off.

<Oscillator Using Voltage Detection Circuit>

Figure 7:
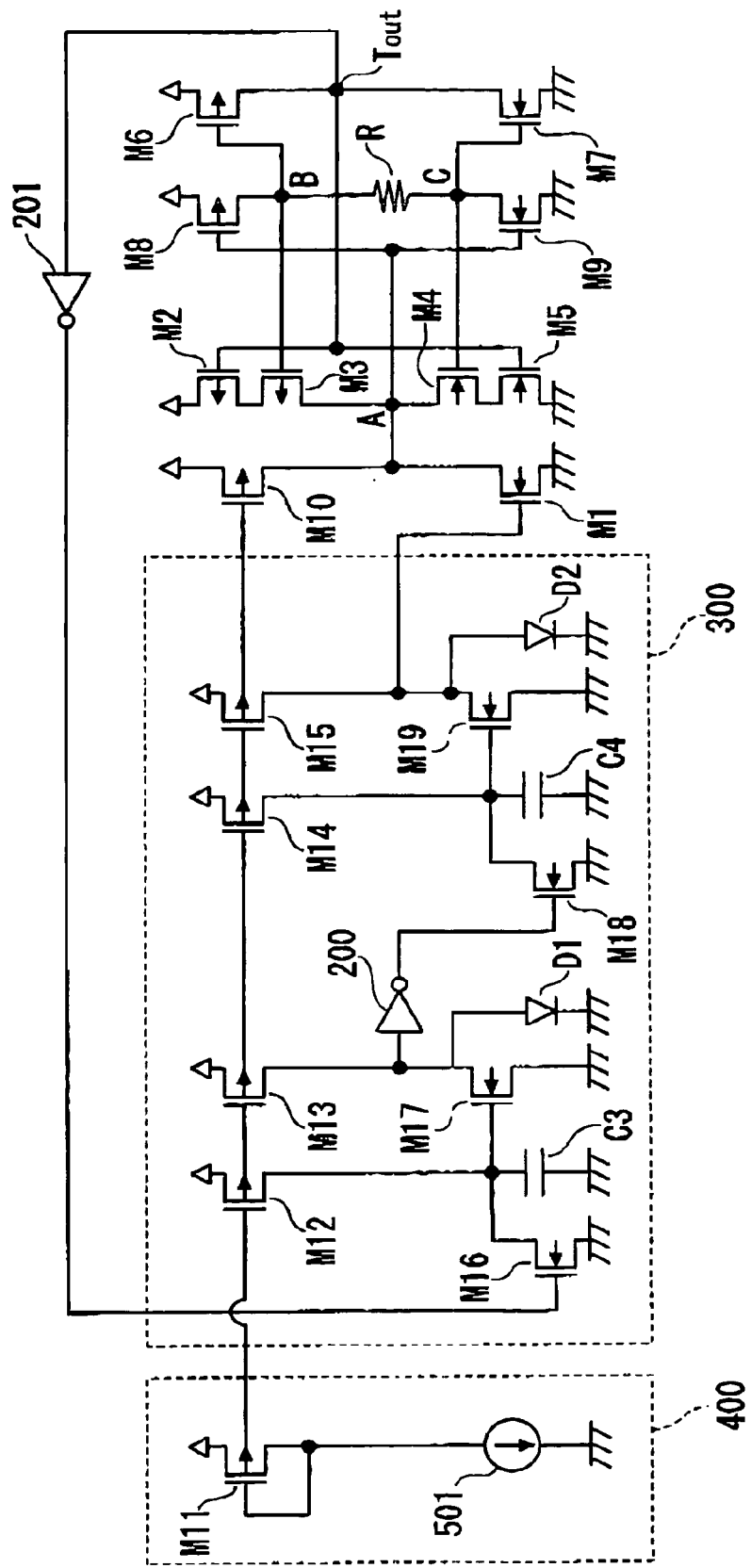
FIG. 7 is a circuit diagram showing a configuration example of an oscillator using the voltage detection circuit according to the embodiments of the present invention.

An oscillator as an applied example of the above voltage detection circuit is configured, for example, as shown in FIG. 7, in such a manner that the voltage detection circuit according to this embodiment shown in FIG. 3 is disposed at an output of a ring oscillator 300, an output of the voltage detection circuit is connected to an input of the ring oscillator 300, and the voltage detection circuit is inserted into a loop of the ring of the ring oscillator 300.

In particular, when oscillation is conducted by a supply voltage that is as high as about several tens V, a delay of the operation of the inverter is increased by an influence of a parasitic capacity. In this applied example, the delay is reduced to obtain an oscillation frequency with high precision in correspondence with the design.

The ring oscillator 300 includes p-channel MOS transistors M12, M13, M14, and M15, n-channel MOS transistors M16, M17, M18, and M19, capacitors C3 and C4, diodes D1 and D2, and an inverter 200.

The oscillation frequency of the ring oscillator is determined according to a period of time required for the potential change in the supply of the electric charges from the MOS transistor M12 to the capacitor C3, the discharge of the electric charges from the capacitor C3 due to the MOS transistor M16, the charge of the electric charges from the MOS transistor M14 into the capacitor C4, and the discharge of the electric charges from the capacitor C4 due to the MOS transistor M18.

The MOS transistor M12 has a source connected to the power supply, and a drain grounded through the capacitor C3.

The MOS transistor M16 has a drain connected to the drain of the MOS transistor M12, a gate connected to the signal output terminal Tout of the voltage detection circuit, and a source grounded.

The MOS transistor M13 has a source connected to the power supply, and a drain connected to an input terminal of the inverter 200.

The diode D1 is connected in series in the forward direction, and is connected between the drain of the MOS transistor M13 and the ground point.

The MOS transistor M17 has a drain connected to the drain of the MOS transistor M13, a gate connected to the drain of the MOS transistor M12, and a source grounded.

The MOS transistor M14 has a source connected to the power supply, and a drain grounded through the capacitor C4.

The MOS transistor M18 has a drain connected to the drain of the MOS transistor M14, a gate connected to an output terminal of the inverter 200, and a source grounded.

The MOS transistor M15 has a source connected to the power supply, and a drain connected to the gate of the MOS transistor M1 of the voltage detection circuit.

The diode D2 is connected in series in the forward direction, and is connected between the drain of the MOS transistor M15 and the ground point.

The MOS transistor M19 has a drain connected to the drain of the MOS transistor M15, a gate connected to the drain of the MOS transistor M14, and a source grounded. The signal output terminal Tout of the voltage detection circuit is input to the gate of the MOS transistor M16 through an inverter 201.

The respective gates of the MOS transistors M12, M13, M14, and M15 are connected to the gate of the p-channel MOS transistor M11 of a constant current source 400.

The MOS transistor M11 has a source connected to the power supply, a gate connected to the drain, and a drain connected to a constant current source 501.

Accordingly, each of the MOS transistors M12, M13, M14, and M15 constitutes a current mirror circuit together with the MOS transistor M11.

Also, the constant current source 500 of FIG. 3 is the p-channel MOS transistor M10 that constitutes the current mirror circuit together with the MOS transistor M11.

In the ring oscillator 300, the width of the amplitude which is output to the inverter 200 is reduced by means of the diode D1 as compared with the supply voltage, respectively. The width of the amplitude which is output to the level converter is reduced by means of the diode D2 as compared with the supply voltage. As a result, the charging and discharging times are shortened, to thereby reduce an influence on the oscillation frequency.

However, when feedback to the initial stage from the final output stage is conducted, and a level converter for conversion into the amplitude of the supply voltage is added to the output stage, a signal waveform that is fed back from the output stage to the input stage is rounded due to the parasitic capacity of the wiring of the feedback, the capacity of the input terminal of the level converter, and the parasitic capacity of the wiring up to the input terminal. As a result, the oscillation frequency is deviated from a design value.

As with the configuration of the ring oscillator shown in FIG. 7, the voltage detection circuit according to the present invention is disposed between a loop between the output stage and the input stage through the inverter 201 for phase focusing. As a result, there can be provided an oscillator which is capable of making the transitional displacement higher in speed, prevents the change timing of the signal that is input to the input stage from being delayed by the parasitic capacity or the like, and is high in precision which complies with the design.

Figure 8:
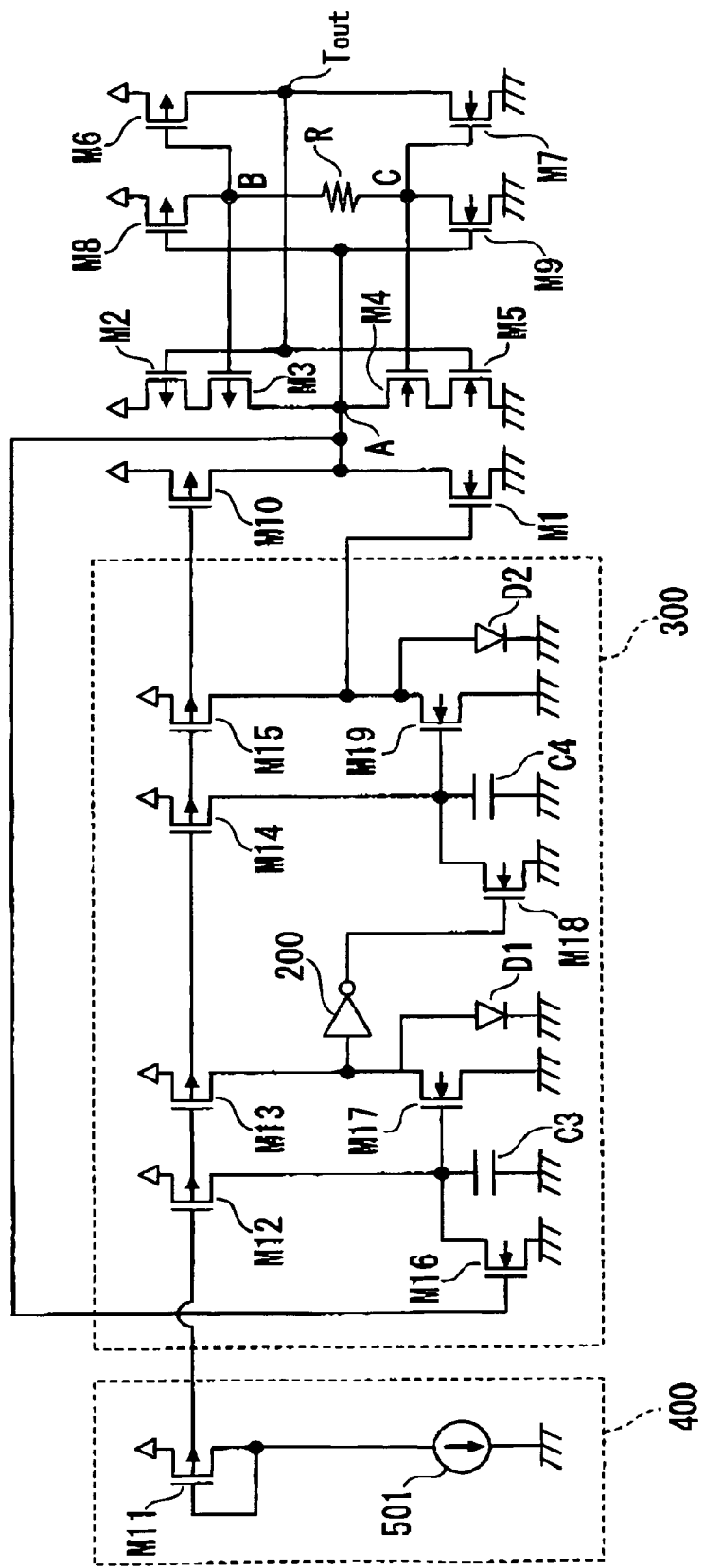
FIG. 8 is a circuit diagram showing another configuration example of the oscillator using the voltage detection circuit according to the embodiments of the present invention.

Also, likewise, as shown in FIG. 8, it is possible that the input of the voltage detection circuit according to the present invention is connected to the output stage of the ring oscillator to provide the function of the level converter, and the output of the voltage detection circuit is connected to the load.

The same advantages as those in the above configuration of FIG. 7 can be obtained by a configuration in which the connection point A of the voltage detection circuit is connected to the input terminal of the inverter at the input stage of the ring oscillator 300.

What is claimed is:

1. A voltage detection circuit, comprising:
an input buffer comprising a current source and a first MOS transistor which are connected in series, which outputs a detection voltage which is input to a gate of the first MOS transistor as an input voltage;
an output buffer comprising a second MOS transistor of a p-channel type having a source connected to a power supply and a drain connected to a signal output terminal, and a third MOS transistor of an n-channel type having a source grounded and a drain connected to the signal output terminal;
a timing adjustment circuit having a signal input terminal connected to a drain of the first MOS transistor, a first output terminal connected to a gate of the second MOS transistor, a second output terminal connected to a gate of the third MOS transistor, which drops voltage of the first output terminal and voltage of the second output terminal when the input voltage that is input to the signal input terminal rises, raises the voltage of the first output terminal and the voltage of the second output terminal when the input voltage drops, and shifts dropping timing and raising timing between the voltage of the first output terminal and the voltage of the second output terminal; and a voltage detection section that accelerates rising and dropping speeds of the input voltage based on a change in the voltage of the first output terminal and the voltage of the second output terminal, and a change in a voltage of the signal output terminal.

2. A voltage detection circuit according to claim 1,
wherein the input buffer comprises a constant current source, and the first MOS transistor of one of the n-channel type and the p-channel type, which is connected in series with the constant current source between the power supply and a ground point, and which has a gate applied with the detection voltage, and
wherein the voltage detection section comprises:
   a fourth MOS transistor of the p-channel type having a source connected to the power supply, and a gate connected to the signal output terminal;
   a fifth MOS transistor of the p-channel type having a source connected to a drain of the fourth MOS transistor, a gate connected to the first output terminal, and a drain connected to a connection point of the first MOS transistor and the current source;
   a sixth MOS transistor of the n-channel type having a drain connected to the drain of the fifth MOS transistor, and a gate connected to the second output terminal; and
   a seventh transistor of the n-channel type having a drain connected to a source of the sixth MOS transistor, a gate connected to the signal output terminal, and a source grounded.

3. A voltage detection circuit according to claim 2, wherein the timing adjustment circuit drops the voltage of the second output terminal at timing earlier than that of the first output terminal when the input voltage rises, and raises the voltage of the first output terminal at timing earlier than that of the second output terminal when the input voltage drops.

4. A voltage detection circuit according to claim 2, wherein the timing adjustment circuit comprises:
   an eighth MOS transistor of the p-channel type having a source connected to the power supply, a gate connected to the signal input terminal, and a drain connected to the first output terminal;
   a ninth MOS transistor of the n-channel type having a drain connected to the second output terminal, a gate connected to the signal input terminal, and a source grounded; and
   a resistor that is connected between the first output terminal and the second output terminal.

5. A voltage detection circuit according to claim 2, wherein the timing adjustment circuit comprises:
   a first delay circuit that transmits a change in the detection voltage with a delay when the detection voltage changes from an "L" level to an "H" level, and transmits the change in the detection voltage without the delay when the detection voltage changes from the "H" level to the "L" level; and
   a second delay circuit that transmits the change in the detection voltage with the delay when the detection voltage changes from the "H" level to the "L" level, and transmits the change in the detection voltage without the delay when the detection voltage changes from the "L" level to the "H" level.

6. A voltage detection circuit according to claim 5,
wherein the first delay circuit comprises a NOR circuit having one input connected to the signal input terminal, another input connected to the signal input terminal through a delay circuit, and an output terminal connected to the second output terminal, and
wherein the second delay circuit comprises a NAND circuit having one input connected to the signal input terminal, another input connected to the signal input terminal through the delay circuit, and an output terminal connected to the first output terminal.

7. A voltage detection circuit according to claim 5,
wherein the first delay circuit comprises: a NAND circuit having one input connected to the signal input terminal, and an output connected to the first output terminal; and a first inverter having an input connected to the output of the NAND circuit, and
wherein the second delay circuit comprises: a NOR circuit having one input connected to the signal input terminal, another input connected to an output of the first inverter, and an output connected to the second output terminal; and a second inverter having an input connected to the output of the NOR circuit, and an output connected to another input of the NAND circuit.

8. An oscillator comprising the voltage detection circuit according to claim 1, that is inserted between an output terminal of a final-stage inverter of a ring oscillator having a plurality of stages of inverters connected to each other and an input terminal of a first-stage inverter of the ring oscillator.

9. An oscillator comprising the voltage detection circuit according to claim 1, having an input connected to an output terminal of a final-stage inverter of a ring oscillator having a plurality of stages of inverters connected to each other, and an input buffer having an output connected to an input terminal of a first-stage inverter of the ring oscillator.

* * * * *